Figure 1:
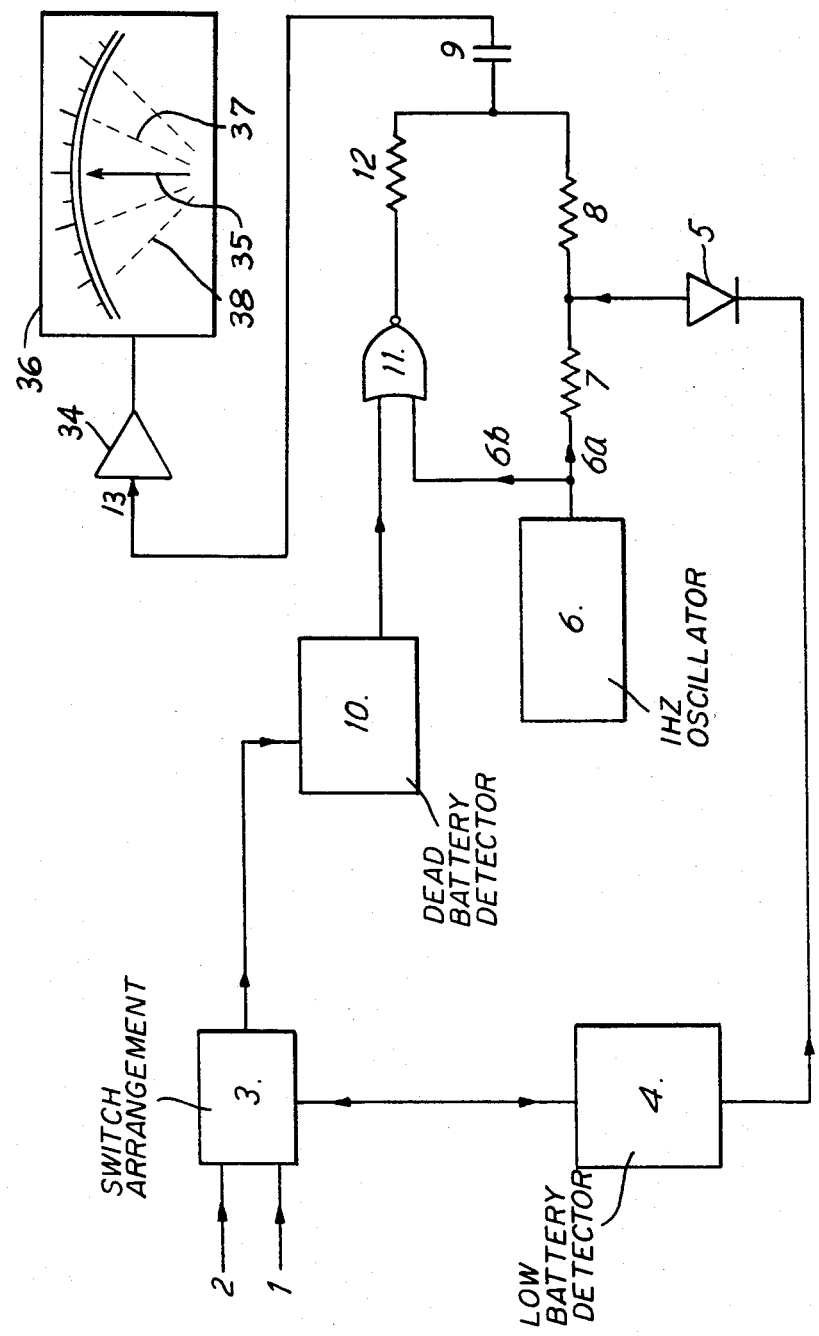

United States Patent [19]

Marsh

[11] Patent Number: 4,535,325

[45] Date of Patent: Aug. 13, 1985

[54] LOW CHARGE DETECTOR

[75] Inventor: Hugh R. Marsh, Canterbury, England

[73] Assignee: Thorn Emi Instruments Limited, Dover, England

[21] Appl. No.: 510,586

[22] Filed: Jul. 5, 1983

[30] Foreign Application Priority Data

Jul. 8, 1982 [GB] United Kingdom ............... 8219857

[51] Int. Cl.³ ............................................. G08B 21/00
[52] U.S. Cl. .................................. 340/636; 324/76 R; 324/155; 324/435; 324/436; 340/691; 340/657
[58] Field of Search ............. 340/636, 691, 657, 654; 324/76 R, 125, 139, 155, 157, 435, 436

[56] References Cited

U.S. PATENT DOCUMENTS

| | | | |
|---|---|---|---|
| 1,922,792 | 8/1933 | Cain | 324/157 |
| 2,827,610 | 3/1958 | Hiser | 324/125 X |
| 3,383,580 | 5/1968 | Wallace, Jr. | 340/636 X |
| 3,412,328 | 11/1968 | Lowery | 324/125 X |
| 3,412,332 | 11/1968 | Parker et al. | 324/157 |
| 3,550,105 | 12/1970 | De Cola et al. | 324/436 X |
| 3,739,264 | 6/1973 | Resh | 340/636 X |
| 3,916,400 | 10/1975 | Lewis | 340/657 X |
| 4,338,596 | 7/1982 | Huber et al. | 324/436 X |
| 4,376,265 | 3/1983 | Kinchi et al. | 324/436 X |

*Primary Examiner*—James L. Rowland
*Assistant Examiner*—Daniel Myer
*Attorney, Agent, or Firm*—Fleit, Jacobson, Cohn & Price

[57] ABSTRACT

A low charge detector, for a measuring instrument incorporating a meter for indicating measurement readings, includes a "low battery detector" circuit which causes a first output to be released from a 1 Hz oscillator, when a battery pack supplying power to the instrument discharges to a predetermined level. The first output is then applied to a pointer on the meter, thus causing the pointer to execute oscillations of a relatively small amplitude.

When the battery pack is substantially dead, a "dead battery detector" circuit causes a second output to be released from the oscillator and to combine with the first output. The combined output is then applied to the pointer, thus causing the pointer to execute oscillations of a substantially greater amplitude, thereby indicating that recharging of the battery pack is required.

6 Claims, 2 Drawing Figures

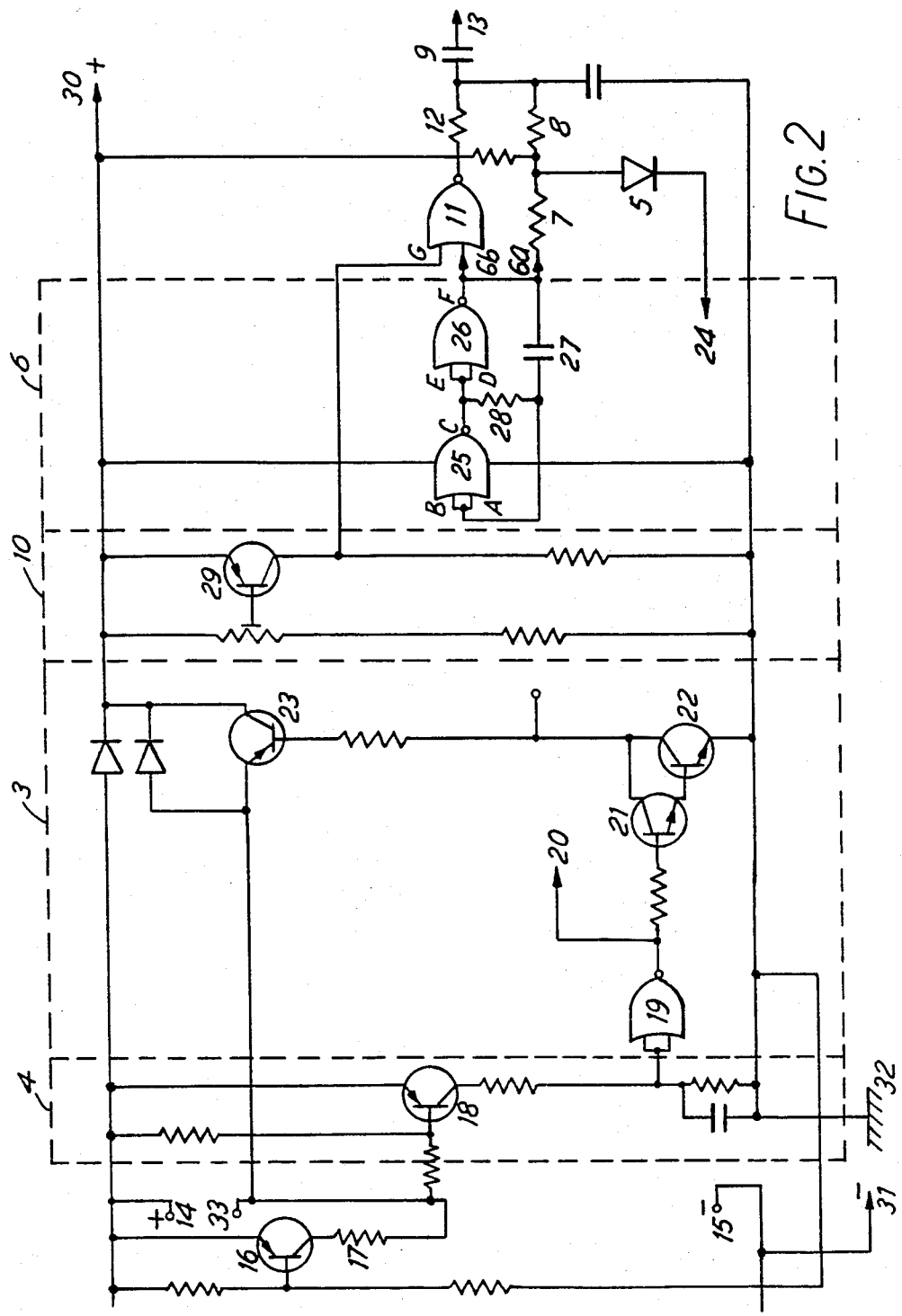

LOW CHARGE DETECTOR

This invention relates to low charge detectors for batteries and particularly, though not exclusively, to those utilised in measuring instruments incorporating a meter from which measurements may be read.

It is frequently important that a battery supplying power to instruments of this kind, which may, for example, measure voltage or resistance, should not fail without warning, as this could prove dangerous to the instrument user.

Also, it has been shown to be beneficial to allow some types of batteries, such as nickel cadmium batteries, which may be used in these instruments to discharge completely before recharging. Without a low battery warning it would be necessary to keep the battery constantly in a well-charged state, which could cause the battery cells to lose their capacity after only a few years.

To overcome these problems, low battery charge detectors have already been provided in such measuring instruments.

However, the detectors known heretofore generally comprise a separate additional meter, a buzzing alarm, or a neon indicator light, none of which is particularly convenient and all of which may add substantial expense to the instrument.

Moreover, a neon indicator light may not be visible in bright sunlight, and a buzzing alarm may not be audible when the instrument is being used in noisy conditions.

It is therefore an object of the present invention to provide an improved low battery charge detector substantially for use in measuring instruments of the abovementioned type.

According to the present invention there is provided a low charge detector suitable for use in a measuring instrument comprising a meter having a moveable measuring indicator associated therewith and a rechargeable means for supplying power to the instrument, said detector comprising means for causing said indicator to execute oscillations of a first amplitude when said rechargeable means reaches a first predetermined level of exhaustion and means for causing the indicator to execute oscillations of a second amplitude when said rechargeable means reaches a second predetermined level of exhaustion.

Preferably, the second amplitude is substantially larger than the first amplitude.

Also, in the preferred embodiment of the present invention, the second level of exhaustion is chosen to be when the battery pack is substantially dead, so that once oscillations of the second amplitude are applied to the indicator, the instrument should not be used again until the battery pack has been recharged.

With this preferred arrangement, it can easily be appreciated that certain types of battery, such as nickel cadmium, can be allowed to discharge completely before recharging.

The invention will now be further described by way of example only with reference to the accompanying diagrams, in which:

FIG. 1 shows a schematic circuit diagram of one embodiment of the present invention, which may be incorporated within a measuring instrument, and FIG. 2 shows a detailed circuit diagram of the embodiment shown in FIG. 1.

Referring to FIG. 1, outputs from two series-connected batteries are shown at 1 and 2 respectively. The output 1 is derived from a battery which, because of its location, discharges at a relatively fast rate and the output 2 is derived from a second battery, connected in series with the first, and which discharges at a substantially slower rate.

Initially, when both batteries are well charged, the first battery is connected via a switch arrangement 3 to a "low battery detector" circuit 4. When the first battery has discharged to a predetermined level, an output from the "low battery detector" circuit 4 is applied to diode 5.

An output from diode 5 then allows a first output 6a to be released from a 1 Hz oscillator 6, via resistors 7 and 8 and capacitor 9, and to be subsequently applied, via an output 13 and an amplifier 34, to a pointer 35 on a meter 36 of a measuring instrument (not shown), thus causing the pointer to execute oscillations 37 of a relatively small amplitude.

These oscillations 37 indicate to the user of the instrument that the battery pack supplying power thereto is, say, 80% exhausted.

At the instant the battery 1 has discharged to its predetermined level, the switch arrangement 3 connects the second battery to a "dead battery detector" circuit 10, which monitors the state of charge of the second battery and, when it has discharged to a predetermined level, an output from "dead battery detector" circuit 10 causes an integrated circuit 11 to allow a second output 6b from the 1 Hz oscillator 6 to pass, via resistor 12 and capacitor 9, to output 13 and the amplifier 34 and thereby to the pointer 35.

The second output 6b therefore combines with the first output 6a to cause the pointer 35 to execute oscillations 38 of a substantially greater amplitude, thereby indicating to the user of the instrument that the battery pack is substantially dead and that the instrument should not be used again until the battery has been recharged.

The voltage applied to the working circuits is always approximately equal to the voltage of battery 2, irrespective of whether battery 1 is in circuit.

In FIG. 2, like components are labelled with like reference numerals with respect to FIG. 1 and sections of the circuit enclosed within the dotted lines refer to block circuits 3, 4, 6 and 10 in FIG. 1 and are labelled accordingly.

Referring now to FIG. 2, the battery inputs, 1 and 2 (shown in FIG. 1), are connected in series to the circuit via battery terminals 14 and 15 and battery tap 33, and the battery pack supplying power to the instrument is connected via circuit outputs 30 and 31. Output 31 is connected to earth at 32 while the instrument is in use, i.e. during the time that power is drained from the battery pack.

Output 1 is initially applied to transistor 16, which is conducting, and resistor 17, until, at a predetermined level of discharge, transistor 18, which is also conducting, turns off. The output of transistor 18 therefore goes low and it is inverted by integrated circuit 19 to produce a high output which turns on transistors 21 and 22 and consequently transistor 23. When transistor 23 is turned on, battery 1 is by-passed, and battery 2 is connected to the "dead battery detector" circuit.

The high output from integrated circuit 19 is also applied, via 10 and 24, to the cathode of a conducting diode 5, which is thus turned off.

The junction between resistors 7 and 8, which had been held low by the conducting diode 5, is now released, thereby allowing a first output 6a from the 1 Hz oscillator 6 to be released, via resistors 7 and 8, capacitor 9 and output 13, to the amplifier and pointer, which thus causes oscillations of the pointer of a relatively small amplitude.

The 1 Hz oscillator 6 consists of two integrated circuits, 25 and 26, which are connected as inverters, together with capacitor 27 and resistor 28. When inputs A and B of integrated circuit 25 are low, output C is high, inputs D and E of integrated circuit 26 are high and output F is low and the upper end of resistor 28 is high. Capacitor 27 charges via resistor 28 to a sufficient level to make inputs A and B high. This causes the state of outputs C and F to reverse, so that output C is low and output F is high, and so capacitor 27 consequently discharges to make inputs A and B low again. This cycle of operations is then repeated to produce an oscillatory output.

When battery 2 has also discharged to a predetermined level, previously conducting transistor 29 turns off and its output goes low.

Input G of integrating circuit 11 now allows a second output 6b (as well as the first output 6a) to pass from the 1 Hz oscillator 6, via resistor 12, capacitor 9 and output 13.

The first and second outputs, 6a and 6b respectively, are therefore combined, via output 13, and this combined output is applied to the pointer, via the amplifier, to produce oscillations of the pointer of a substantially larger amplitude.

It will be appreciated that this arrangement only provides one embodiment of the present invention and that alternative circuit configurations may be envisaged by persons skilled in the art.

I claim:

1. A low charge detector suitable for use in a measuring instrument comprising a meter having a moveable measuring indicator associated therewith and a rechargeable means for supplying power to the instrument, said detector comprising means for causing said indicator to execute oscillations of a first amplitude when said rechargeable means reaches a first predetermined level of exhaustion and means for causing the indicator to execute oscillations of a second amplitude when said rechargeable means reaches a second predetermined level of exhaustion.

2. A low charge detector as claimed in claim 1 wherein the second amplitude is substantially greater than the first amplitude.

3. A low charge detector as claimed in claim 1 wherein the means for causing the indicator to execute oscillations of a first amplitude includes a first battery which discharges to a predetermined level at which oscillations of said first amplitude are released and applied to the indicator.

4. A low charge detector as claimed in claim 1 wherein the means for causing the indicator to execute oscillations of a second amplitide includes a second battery which discharges to a predetermined level at which further oscillations are released, said further oscillations combining with the oscillations of said first amplitude to produce oscillations of said second amplitude which are applied to the indicator.

5. A low charge detector as claimed in claim 1 wherein the oscillations of said first amplitude and the oscillations of said second amplitude are respectively applied to the indicator via an amplifier.

6. A low charge detector as claimed in claim 1 wherein said second predetermined level of exhaustion is the level at which the rechargeable means is substantially dead.

* * * * *